United States Patent
Wachtmann (10) Patent No.: US 7,906,359 B2
(45) Date of Patent: Mar. 15, 2011

(54) METHOD OF FORMING A SURFACE MICROMACHINED MEMS DEVICE

(75) Inventor: Bruce K. Wachtmann, Concord, MA (US)

(73) Assignee: Analog Devices, Inc., Norwood, MA (US)

( * ) Notice: Subject to any disclaimer, the term of this patent is extended or adjusted under 35 U.S.C. 154(b) by 1521 days.

(21) Appl. No.: 10/670,673

(22) Filed: Sep. 25, 2003

(65) Prior Publication Data

US 2004/0104453 A1   Jun. 3, 2004

Related U.S. Application Data

(63) Continuation-in-part of application No. 10/308,688, filed on Dec. 3, 2002, now abandoned.

(51) Int. Cl.
*H01L 21/00* (2006.01)

(52) U.S. Cl. .................... 438/52; 257/E21.001

(58) Field of Classification Search .......... 438/52, 438/453, 43
See application file for complete search history.

(56) References Cited

U.S. PATENT DOCUMENTS

| | | | |
|---|---|---|---|
| 5,216,490 A | 6/1993 | Greiff et al. | |
| 5,326,726 A | 7/1994 | Tsang et al. | |
| 5,343,064 A | 8/1994 | Spangler et al. | |
| 5,399,415 A | 3/1995 | Chen et al. | 428/209 |
| 5,578,224 A | 11/1996 | Core | |
| 5,639,542 A | 6/1997 | Howe et al. | |
| 5,640,039 A | 6/1997 | Chau et al. | |
| 5,798,283 A * | 8/1998 | Montague et al. | 438/24 |
| 5,828,115 A | 10/1998 | Core | |
| 5,858,809 A | 1/1999 | Chau et al. | |
| 5,879,963 A | 3/1999 | Howe et al. | |
| 5,919,548 A * | 7/1999 | Barron et al. | 428/138 |
| 5,939,633 A | 8/1999 | Judy | |
| 6,021,675 A | 2/2000 | Seefeldt et al. | |
| 6,160,314 A * | 12/2000 | Lee et al. | 257/752 |
| 6,500,763 B2 * | 12/2002 | Kim et al. | 438/689 |
| 6,505,511 B1 | 1/2003 | Geen et al. | |
| 2002/0117728 A1* | 8/2002 | Brosnihan et al. | 257/446 |
| 2004/0152272 A1* | 8/2004 | Fladre et al. | 438/284 |

FOREIGN PATENT DOCUMENTS

| | | |
|---|---|---|
| DE | 198 47 455 A1 | 4/2000 |
| EP | 0 834 759 A2 | 8/1998 |
| WO | WO 02/12116 A2 | 2/2002 |

OTHER PUBLICATIONS

*The International Search Report*, International Searching Authority, Sep. 23, 2004, 6 pages.

Timothy J. Brosnihan et al., Embedded Interconnect and Electrical Isolation for High-Aspect-Ration, SIO Inertial Instruments; Jun. 16-19, 1997; pp. 637-640.

* cited by examiner

*Primary Examiner* — Marcos D. Pizarro
(74) *Attorney, Agent, or Firm* — Sunstein Kann Murphy & Timbers LLP (57) ABSTRACT

A method of forming a surface micromachined MEMS device applies an insulator to a substrate, and then deposits a conductive path on the insulator. The conductive path is capable of transmitting an electronic signal between two points on the MEMS device. The insulator electrically isolates the conductive path from the substrate. The MEMS device illustratively is free of semiconductor junctions formed by the substrate and the conductive path.

13 Claims, 6 Drawing Sheets

METHOD OF FORMING A SURFACE MICROMACHINED MEMS DEVICE

PRIORITY

This patent application is a continuation-in-part and thus, claims priority from U.S. patent application Ser. No. 10/308,688, filed Dec. 3, 2002, entitled, "MEMS DEVICE WITH ALTERNATIVE ELECTRICAL CONNECTIONS," and naming Bruce Wachtmann, David Collins, and Thomas Chen as inventors, the disclosure of which is incorporated herein, in its entirety, by reference.

FIELD OF THE INVENTION

The invention generally relates microelectromechanical systems and, more particularly, the invention relates to electrical connections on microelectromechanical systems.

BACKGROUND OF THE INVENTION

Microelectromechanical systems ("MEMS") are used in a growing number of applications. For example, MEMS currently are implemented as gyroscopes to detect pitch angles of airplanes, and as accelerometers to selectively deploy air bags in automobiles. In simplified terms, such MEMS devices typically have a structure suspended above a substrate, and associated electronics that both senses movement of the suspended structure and delivers the sensed movement data to one or more external devices (e.g., an external computer). The external device processes the sensed data to calculate the property being measured (e.g., pitch angle or acceleration).

Many types of MEMS sensors, such as those discussed above, are manufactured by means of conventional surface micromachining ("SMM") techniques. As known by those skilled in the art, surface micromachining techniques build material layers on top of a substrate using additive and subtractive processes. Unlike processes that use silicon-on-insulator ("SOI") wafers, these processes do not require wafer to wafer bonding.

U.S. Pat. No. 5,326,726 ("Tsang") and U.S. Pat. No. 5,828,115 ("Core") discuss two conventional SMM processes. The sensors shown by both patents have a conductive layer that connects structure to circuitry. For example, FIGS. 1 and 2 of the Core patent show a sensor having a ground plane 50 that electrically connects a mass 12 to a contact 68 via a diffused runner 66 embedded in its substrate 36. As noted at lines 62-64 of column 2 of the patent, this arrangement creates a "large" parasitic capacitance between the ground plane 50 and the substrate 36. In fact, this parasitic capacitance can corrupt electronic signals transmitted through the ground plane 50.

A semiconductor junction within the Core sensor significantly contributes to this parasitic capacitance. More specifically, the point where the diffused runner 66 meets the substrate 36 appears to create a semiconductor junction similar to that in a diode. Under certain conditions, that junction undesirably can begin conducting. For example, if the sensor is near a heat source (e.g., under the hood of an automobile), the increased temperatures can cause the junction to leak, thus causing unintended conduction. As a further example, relatively high voltages applied to the sensor also can cause the junction to begin conducting.

SUMMARY OF THE INVENTION

In accordance with one aspect of the invention, junctions between a sensor substrate and a conductive path are eliminated, thus eliminating one source for parasitic capacitances. To those ends, a method of forming a surface micromachined MEMS device applies an insulator to a substrate, and then deposits a conductive path on the insulator. The conductive path is capable of transmitting an electronic signal between two points on the MEMS device. The insulator electrically isolates the conductive path from the substrate. The MEMS device illustratively is free of semiconductor junctions formed by the substrate and the conductive path (i.e., the substrate and conductive path do not together form a semiconductor junction).

The method also may form circuitry and structure, which serve the function of the two above noted points, and connect the conductive path between the circuitry and the structure. In some embodiments, the structure is electrically isolated from the substrate. Moreover, among other things, the substrate may be produced from substantially intrinsic silicon, while the conductive path may be formed from polysilicon.

The method may apply multiple layers of conductive paths. To that end, the method may apply an additional insulator above the conductive path, and then deposit an additional conductive path to the additional insulator. The conductive path and additional conductive path illustratively are in different planes of the MEMS device. As noted above, embodiments of the MEMS device are free of semiconductor junctions between the substrate and the conductive path. The substrate also may be free of embedded electrodes.

In accordance with another aspect of the invention, a MEMS device has a substrate, movable structure and circuitry supported by the substrate, and a conductive path between the movable structure and the circuitry. The conductive path is electrically isolated from the substrate and formed within the MEMS device by surface micromachined processes. The MEMS device is free of semiconductor junctions between the substrate and the conductive path.

In accordance with another aspect of the invention, a method of forming a sensor forms an insulator on a substantially intrinsic substrate and forms a conductive path on the insulator. The insulator is deposited (or grown) and the conductive layer is formed by surface micromachining processes. The insulator electrically isolates the conductive path from the substrate. The method also forms circuitry and structure, and connects the conductive path between the circuitry and the structure. The conductive path is capable of transmitting an electronic signal between the circuitry and the structure.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments, a MEMS sensor produced by surface micromachining ("SMM") processes has no semiconductor junctions between its substrate and conductive paths. Accordingly, such embodiments eliminate parasitic capacitances produced by these junctions. Other embodiments space the conducive paths from the substrate in a manner that significantly reduces their potential parasitic capacitance. Details of these and other embodiments are discussed below.

Figure 1:
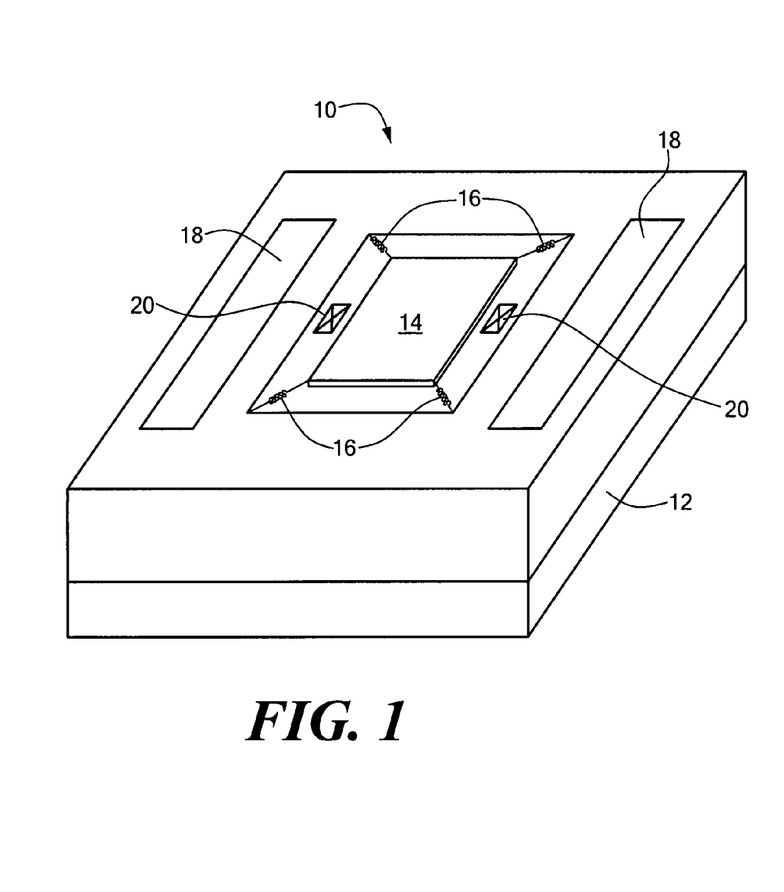
FIG. 1 schematically shows a surface micromachined MEMS sensor produced in accordance with illustrative embodiments of the invention.

FIG. 1 schematically shows a SMM MEMS sensor 10 produced in accordance with illustrative embodiments of the invention. The sensor 10 includes a substrate 12 and a plurality of additional components supported by the substrate 12. Among other things, such additional components include a movable mass 14 (shown schematically as a single mass), a plurality of flexures 16 coupling the mass 14 to the substrate 12, and circuitry 18 to detect and/or control movement of the mass 14. A plurality of metal contacts 20 on the top surface electrically connect the movable mass 14 with the circuitry 18 and/or external devices (e.g., computers).

The sensor 10 may be any conventionally known MEMS inertial sensor. For example, the sensor 10 may be a gyroscope or an accelerometer. Exemplary MEMS gyroscopes are discussed in greater detail in U.S. Pat. No. 6,505,511, which is assigned to Analog Devices, Inc. of Norwood, Mass. Exemplary MEMS accelerometers are discussed in greater detail in U.S. Pat. No. 5,939,633, which also is assigned to Analog Devices, Inc. of Norwood, Mass. The disclosures of U.S. Pat. Nos. 5,939,633 and 6,505,511 are incorporated herein, in their entireties, by reference.

In a manner similar to those shown in these two patents, the mass 14 shown schematically in FIG. 1 may have one, two or more individual masses that cooperate to provide movement data. Instead of a sensor, however, alternative embodiments may implement other types of devices formed by SMM techniques. Accordingly, discussion of sensors and specific types of sensors is not intended to limit the scope of all embodiments.

Figure 2:
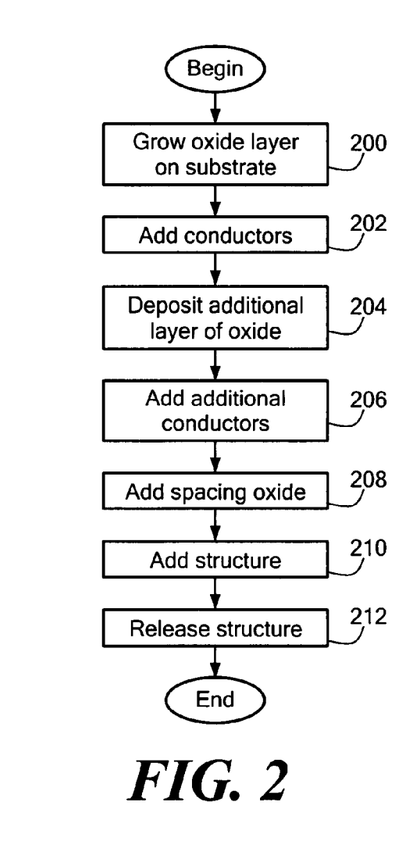
FIG. 2 shows a SMM process of forming the sensor shown in FIG. 1 in accordance with illustrative embodiments of the invention.

As noted above, SMM techniques build material layers on a substrate using additive and subtractive processes. FIG. 2 shows a SMM process of forming the sensor 10 shown in FIG. 1. FIGS. 3-8 show the progression of the SMM process discussed in FIG. 2. The process begins at step 200, in which a base oxide layer 22 is grown on the substrate 12. To that end, conventional local oxidation of silicon processes (known in the art as "LOCOS") may be used to grow a base oxide layer 22 on a substantially intrinsic (i.e., undoped) silicon substrate (see FIG. 3).

Figure 3:
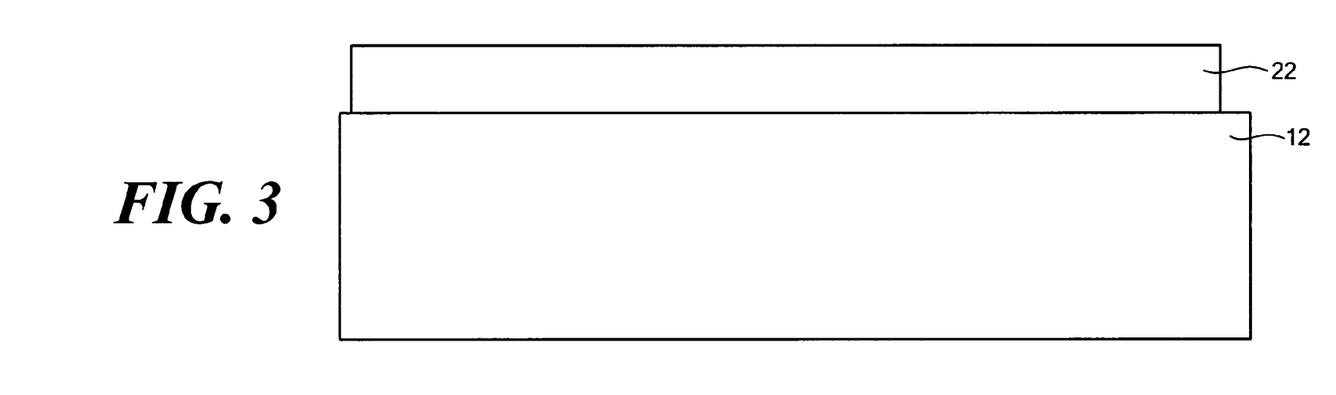
FIG. 3 schematically shows a partially formed sensor illustrating step 200 of the process of FIG. 2.

For example, the base oxide layer 22 may be formed from a thermal silicon dioxide having a thickness of between about 0.15 to 1.5 microns. The thickness of the base oxide layer 22 is selected as a function of the material properties of the oxide (e.g., its dielectric constant). More specifically, that thickness is selected (based on the oxide properties) to mitigate parasitic capacitances formed between the substrate 12 and other components above the substrate 12. These parameters thus are used to ensure that such parasitic capacitances do not significantly impact sensor performance. Further details are discussed below.

Figure 4:
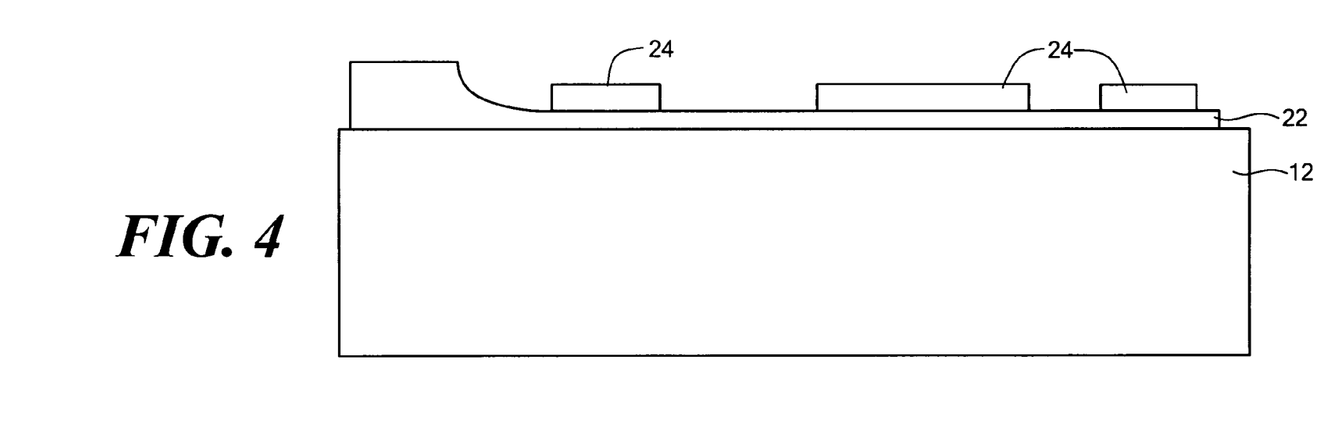
FIG. 4 schematically shows a partially formed sensor illustrating steps 200 and 202 of the process of FIG. 2.

After it is formed, the base oxide layer 22 may be thinned to conform with the requirements of the sensor 10 (see FIG. 4). For example, the base oxide layer 22 may be thinned at some points to a thickness of about 400 to 500 nanometers. Alternatively, the base oxide layer 22 is not thinned.

The process then continues to step 202, in which base conductors 24 are added to the top surface of the base oxide layer 22 (see FIG. 4). In illustrative embodiments, the base conductors 24 are formed from polysilicon to provide any function required of a conductor or element of a semiconductor device (in the sensor 10). Those skilled in the art should appreciate that the base oxide layer 22 both electrically isolates and spaces the base conductors 24 from the substrate 12. Consequently, there is no semiconductor junction formed by (or between) the substrate 12 and base conductors 24, thus eliminating one significant source of parasitic capacitance and leakage in many prior art SMM MEMS sensors. Moreover, as noted above, the spacing can be calculated to substantially mitigate parasitic capacitance produced merely by positioning the substrate 12 near the conductors 24. Accordingly, the base oxide layer 22 mitigates two sources of parasitic capacitance in the sensor 10; namely, parasitic capacitances produced by 1) semiconductor junctions and 2) closely positioned substrates and conductors.

The base conductors 24 may be patterned in a conventional manner as circuitry 18 (e.g., sense or actuation circuitry), interconnects (also referred to as ground planes or conductive paths), or other conventional semiconductor components. See, for example, U.S. Pat. No. 5,326,726 (hereinafter "Tsang") and U.S. Pat. No. 5,828,115 (hereinafter "Core") for exemplary patterning processes, the disclosures of which are incorporated herein, in their entireties, by reference. Both patents discuss conventional methods of performing various steps of FIG. 2. For example, the Tsang patent discusses a conventional chemical vapor deposition technique that may be used for depositing polysilicon base conductors 24 on the base oxide layer 22.

Figure 5:
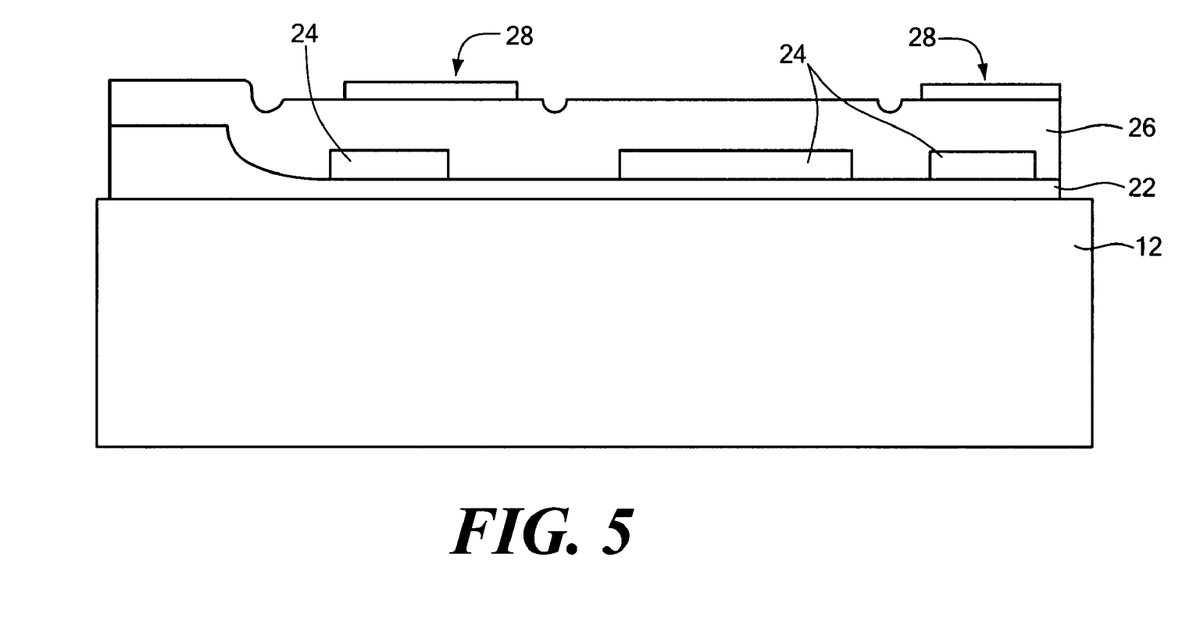
FIG. 5 schematically shows a partially formed sensor illustrating steps 204 and 206 of the process of FIG. 2.

The process then adds an additional oxide layer 26 over the base conductors 24 (step 204, FIG. 5). In illustrative embodiments, the additional oxide layer 26 may be formed from borophosphosilicate glass ("BPSG") having a top surface about 550 nanometers from the top surface of the base oxide layer 22. Those in the art may consider the BPSG to "planarize" the base conductors 24. Alternative embodiments use a different insulation material, such as that used for the base oxide layer 22.

After the additional oxide layer 26 is formed, the process continues to step 206 by adding additional conductors 28 on the additional oxide layer 26. In a manner similar to step 202, the additional conductors 28 may include polysilicon conventionally patterned as circuitry, interconnects, or other components as discussed above. In some embodiments, more layers of oxide (i.e., insulator) and conductors are added above the additional conductors 28 and additional oxide layer 26. Accordingly, although the sensor 10 discussed with reference to FIGS. 3-8 has only two planes of conductors (i.e., conductors 24 and 28), some sensors implementing various embodiments of the invention can have more than two planes of conductors.

Figure 6:
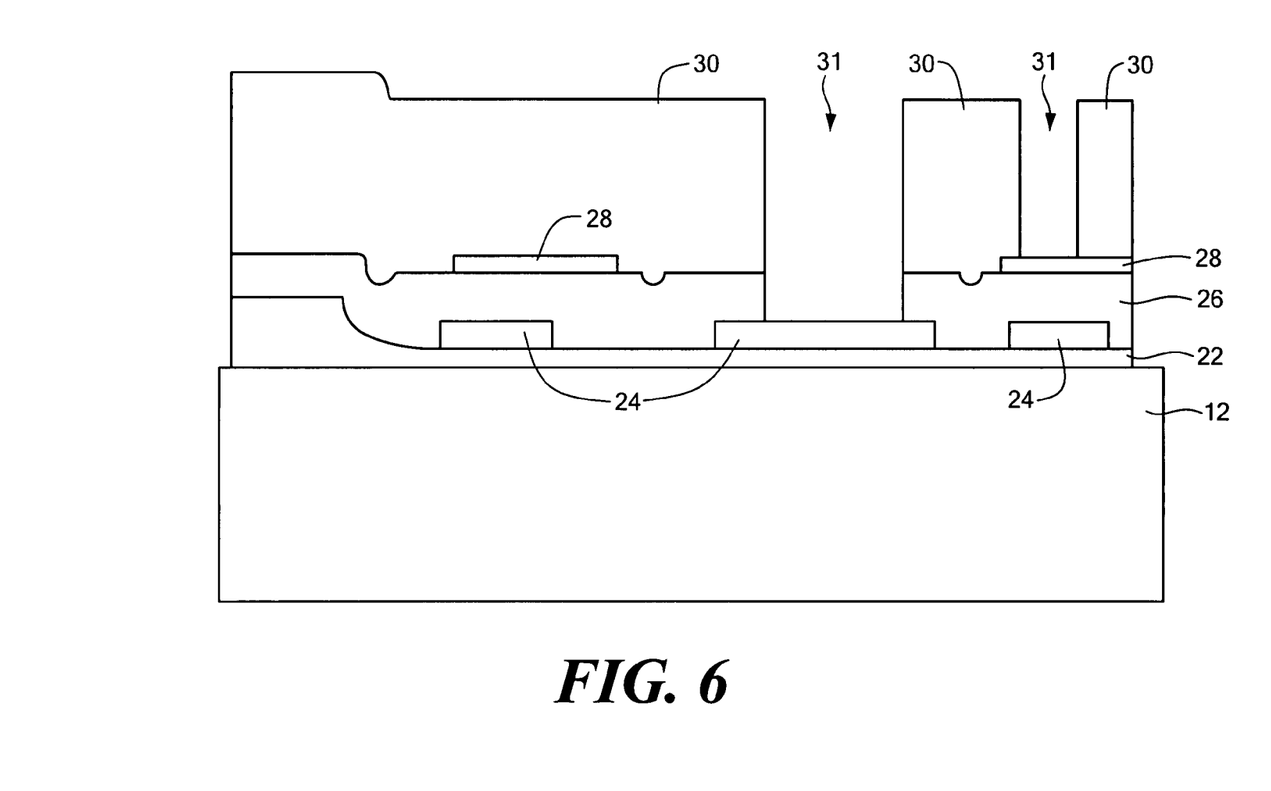
FIG. 6 schematically shows a partially formed sensor illustrating step 208 of the process of FIG. 2.
Figure 7:
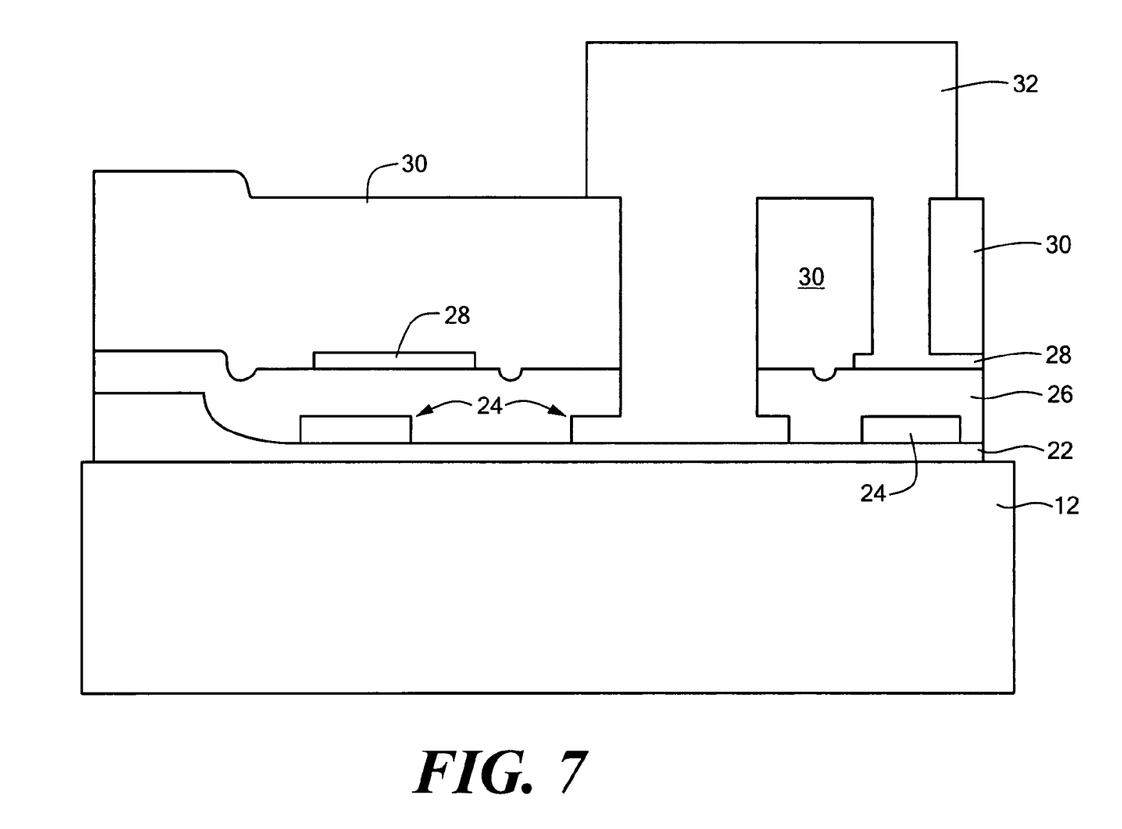
FIG. 7 schematically shows a partially formed sensor illustrating step 210 of the process of FIG. 2.

As shown in FIGS. 6 and 7, after the additional conductors 28 are formed, conventional processes add a spacing oxide 30 over the top of both the additional conductors 28 and additional oxide layer 26 (step 208), and then form the necessary structure 32 (step 210). To those ends, conventional processes etch trenches 31 through the spacing oxide 30. After the trenches 31 are formed, conventional processes form the relevant structure 32 (see above noted incorporated patents for exemplary conventional processes).

The structure 32 may be any conventional structure, such as the noted movable mass 14, which is suspended above the substrate 12 by the flexure system 16. For example, if the sensor 10 is an accelerometer, the structure 32 may be similar to that disclosed in above noted U.S. Pat. No. 5,939,633. If the sensor 10 is a gyroscope, then the structure 32 may be similar to that disclosed in above noted U.S. Pat. No. 6,505,511.

The structure 32 (e.g., the staple) shown in FIG. 7 electrically connects one base conductor 24 with an additional conductor 28 on a different plane of the sensor 10. Alternatively, the additional conductor 28 could contact the base conductor 24 directly by forming a trench in the additional oxide layer 26 and forming a via. The base conductor 24 may include circuitry 18, while the additional conductor 28 (on the higher sensor plane) may act as a ground plane (i.e., an interconnect). Alternatively, the base conductor 24 may act as a ground plane, while the additional conductor 28 may be utilized for circuitry. Of course, both conductors 24 and 28 may be interconnects, or they both may be utilized for circuitry. Those skilled in the art may use the different conductors for yet other functions.

As an example, when a conductor acts as an interconnect or ground plane, it can transmit electronic signals between two points in the sensor 10. Such a signal may have information relating to the movement of the sensor 10. Specifically, such signals may have information relating to actuating or detecting mass movement.

Figure 8:
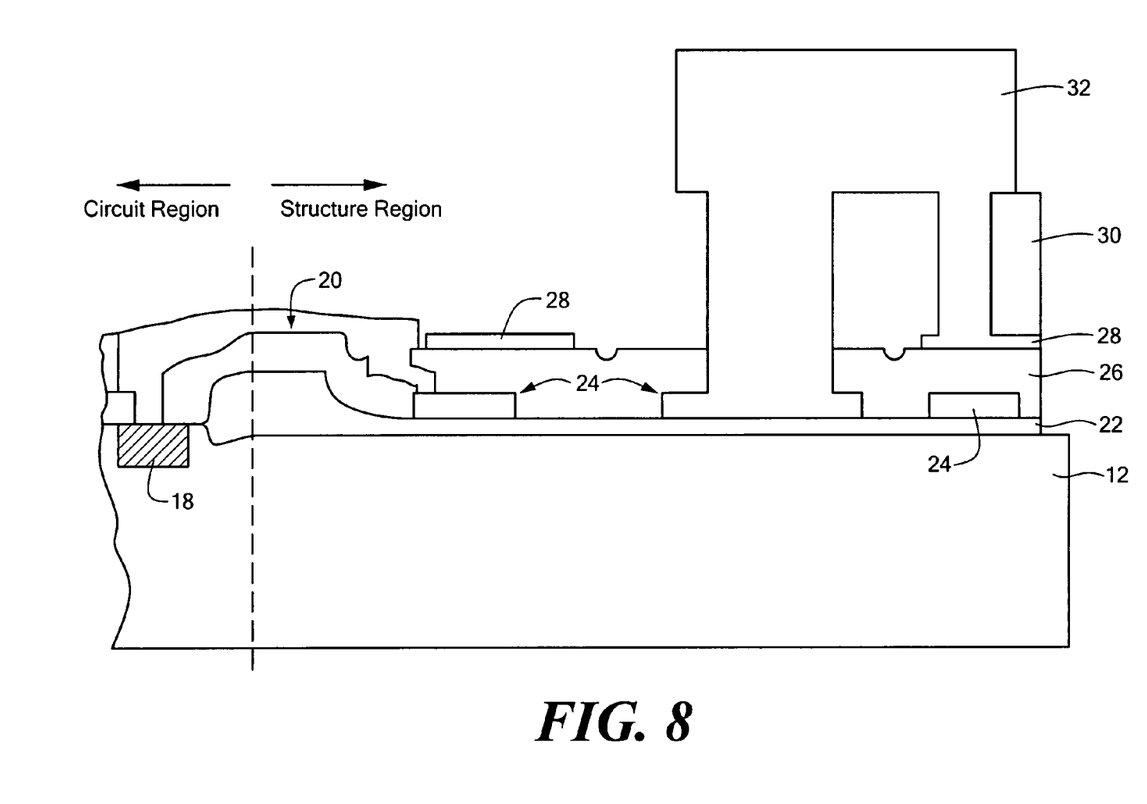
FIG. 8 schematically illustrates step 212 of the process of FIG. 2.

After the structure 32 is formed, the process continues to step 212, in which the structure 32 is released as shown in FIG. 8. More specifically, a conventional aqueous HF release process may be used to remove the spacer oxide, which causes the structure 32 to be suspended above the substrate 12. Illustrative embodiments use a buffered hydrofluoric acid to execute this step. FIG. 8 thus schematically shows the sensor as having a structure region formed by the process of FIG. 2, and a circuitry side formed by other processes.

Additional process steps may be performed to supplement the process discussed above. For example, nitride layers may be added to the top surfaces of the insulator layers, conductors, or both before additional insulator layers are added. As known by those in the art, the nitride layers are substantially impermeable to the aqueous HF release process, thus protecting the underlying layers. Moreover, among other things, the metal contacts 20 (FIGS. 1 and 8) may be added, thus enabling the sensor 10 to electrically connect with external devices. Other conventional processes may be performed to produce the final sensor 10.

Accordingly, as noted above, illustrative embodiments of the invention do not form a semiconductor junction by or between the substrate 12 and any other component on the noted structure region. Parasitic capacitances caused by such junctions thus are eliminated, consequently eliminating the potential for such capacitance to distort signals within the sensor 10. Eliminating the junctions also 1) permits relatively high voltages to drive the movable mass 14 and 2) eliminates some noise caused by prior art sensors. The sensor 10 also can be used in high temperature applications (e.g., near the motor in an automobile) without the concern that a junction (formed at least in part by the substrate 12) undesirably will begin to conduct. Moreover, as noted above, parasitic capacitances potentially formed by the proximity of the substrate 12 and conductors 24 and 28 (and between conductors 24 and 28 on different planes) also are mitigated by appropriately selecting the thickness and type of the various insulators.

Of course, each of these advantages is subject to other design limitations and components of the sensor 10. It should be noted, however, that these advantages relate to the specific improvement provided by illustrative embodiments with regard to 1) the noted parasitic capacitance issues caused by the junction and 2) the relatively close spacing of conductors and substrates of prior art sensors.

Some embodiments of the sensor 10 may have semiconductor junctions (such as those used in forming conventional circuit devices) while maintaining the noted spaced and/or electrically isolated configuration between the substrate 12 and noted conductors 24 and 28. For example, some of the junctions may be formed by contact between other components in the circuitry 18 and the substrate 12. Other embodiments, however, may eliminate semiconductor junctions, while still having the parasitic capacitance produced by not sufficiently spacing the substrate 12 from the conductors 24.

Although the discussion above discloses various exemplary embodiments of the invention, it should be apparent that those skilled in the art can make various modifications that will achieve some of the advantages of the invention without departing from the true scope of the invention.

What is claimed is:

1. A method of forming a surface micromachined MEMS device, the method comprising:
   providing a substrate;
   applying an oxide on the substrate;
   depositing a conductive path directly on the oxide, the conductive path being capable of transmitting an electronic signal between two points on the MEMS device, the oxide spacing the conductive path from the substrate, the MEMS device being free of semiconductor junctions formed by the substrate and the conductive path,
   forming circuitry and structure, the circuitry and structure being the two points; and
   connecting the conductive path between the circuitry and the structure.

2. The method as defined by claim 1 wherein the structure is electrically isolated from the substrate.

3. The method as defined by claim 1 wherein the substrate is free of embedded electrodes.

4. The method as defined by claim 1 wherein the conductive path comprises polysilicon.

5. A MEMS device formed by the process of claim 1.

6. The method as defined by claim 1 further comprising:
   applying an additional insulator above the conductive path;
   depositing an additional conductive path to the additional insulator, the conductive path and the additional conductive path being in different planes of the MEMS device.

7. The method as defined by claim 6 further comprising electrically connecting the conductive path and additional conductive path with a connector, the connector being one of a via and a staple.

8. A method of forming a sensor, the method comprising:
   forming an oxide on a substantially intrinsic semiconductor substrate;
   forming a conductive path directly on the oxide, the oxide being formed and the conductive layer being formed by surface micromachining processes, the oxide electrically isolating the conductive path from the substrate;
   forming circuitry and structure; and
   connecting the conductive path between the circuitry and the structure, the conductive path being capable of transmitting an electronic signal between the circuitry and the structure.

9. The method as defined by claim 8 wherein the structure is electrically isolated from the substrate.

10. The method as defined by claim 8 wherein the MEMS device is free of semiconductor junctions formed by the substrate and the conductive path.

11. The method as defined by claim 8 further comprising:
applying an additional insulator above the conductive path; and
depositing an additional conductive path to the additional insulator, the additional conductive path and the conductive path being in different planes of the MEMS device.

12. The method as defined by claim 8 wherein the oxide has a thickness that spaces the substrate and conductive path to a given spacing, the given spacing being between about 0.15 microns and 1.5 microns.

13. A sensor formed by the process of claim 8.

* * * * *